United States Patent
Kim et al.

(10) Patent No.: US 7,778,067 B2
(45) Date of Patent: Aug. 17, 2010

(54) MAGNETIC RANDOM ACCESS MEMORY DEVICE USING CURRENT INDUCED SWITCHING

(75) Inventors: Eun-sik Kim, Seoul (KR); Kook-hyun Sunwoo, Hwaseong-si (KR); Sung-chul Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 355 days.

(21) Appl. No.: 11/896,214

(22) Filed: Aug. 30, 2007

(65) Prior Publication Data

US 2008/0055789 A1    Mar. 6, 2008

(30) Foreign Application Priority Data

Sep. 1, 2006    (KR) ............. 10-2006-0084240

(51) Int. Cl.
*G11C 11/15* (2006.01)
(52) U.S. Cl. .................. 365/158; 257/421
(58) Field of Classification Search ............ 257/421; 365/158
See application file for complete search history.

(56) References Cited

U.S. PATENT DOCUMENTS

| | | | |
|---|---|---|---|
| 6,847,547 B2 * | 1/2005 | Albert et al. | 365/173 |
| 6,900,489 B2 * | 5/2005 | Drewes | 257/295 |
| 7,173,841 B2 * | 2/2007 | Peng et al. | 365/66 |
| 7,259,025 B2 * | 8/2007 | Leuschner et al. | 438/3 |
| 7,345,911 B2 * | 3/2008 | Min et al. | 365/158 |
| 7,349,234 B2 * | 3/2008 | Peng et al. | 365/66 |
| 2006/0146602 A1 * | 7/2006 | Lin et al. | 365/171 |
| 2007/0105241 A1 * | 5/2007 | Leuschner et al. | 438/3 |
| 2007/0188939 A1 * | 8/2007 | Beach et al. | 360/324.2 |
| 2007/0297219 A1 * | 12/2007 | Dittrich et al. | 365/158 |
| 2008/0160641 A1 * | 7/2008 | Min et al. | 438/3 |
| 2009/0128966 A1 * | 5/2009 | Mani et al. | 360/324.2 |

* cited by examiner

*Primary Examiner*—Evan Pert
(74) *Attorney, Agent, or Firm*—Harness, Dickey & Pierce, P.L.C.

(57) ABSTRACT

Provided is a magnetic memory device that uses a current induced switching (CID) method. The magnetic memory device that uses a CID method includes a lower electrode, a magnetic resistance structure that is formed on the lower electrode which comprises a free layer whose widths of two sides are varied, and an upper electrode formed on the magnetic resistance structure.

12 Claims, 5 Drawing Sheets

MAGNETIC RANDOM ACCESS MEMORY DEVICE USING CURRENT INDUCED SWITCHING

This U.S. non-provisional patent application claims the benefit of priority under 35 U.S.C. §119 to Korean Patent Application No. 10-2006-0084240, filed on Sep. 1, 2006, in the Korean Intellectual Property Office (KIPO), the disclosure of which is incorporated herein in its entirety by reference.

BACKGROUND

As the information industry develops, larger information treatment may be required. Therefore, the demand for a data storage medium that can store a large capacity of information continuously increases. Due to this increased demand, studies about smaller information storage mediums having higher data storing speeds have been conducted, and as a result, various kinds of information storage apparatuses have been developed.

Information storage apparatuses may be divided into volatile information storage apparatuses and non-volatile information storage apparatuses. In the case of volatile information storage apparatuses, when power is turned off all recorded information may be erased. However, volatile information storage apparatuses may have a higher information recording and/or reproducing speed. In the case of non-volatile information storage apparatuses, recorded information may not be erased even if power is turned off.

An example of a volatile information storage apparatus is a dynamic random access memory (DRAM) device. Examples of non-volatile information storage apparatuses may include a hard disc drive (HDD) and a random access memory (RAM) device.

FIG. 1A is a cross-sectional view of a magnetic random access memory (MRAM), which is an example of a related art non-volatile information storage apparatus.

Referring to FIG. 1A, a magneto-resistive structure 14 may be formed on a base electrode 12, which may be electrically connected to a transistor 10. A first conductive line 16a may be formed on a lower side of the base electrode 12 in a region corresponding to the magneto-resistive structure 14. A second conductive line 16b may be formed on the magneto-resistive structure 14. In the related art MRAM, to record information, a magnetic field may be applied to the magneto-resistive structure 14 to magnetize a magnetic material of the magneto-resistive structure 14 into one of two memory states.

For example, when a current flows in the first conductive line 16a or second conductive line 16b, a magnetic field may be generated around the first conductive line 16a or the second conductive line 16b. The generated magnetic field determines the magnetization direction of a free layer 104, of the magneto-resistive structure 14, and thus, information may be recorded. The magneto-resistive structure 14 may include an anti-ferromagnetic layer 101, a fixed layer 102 whose magnetization direction is fixed by the anti-ferromagnetic layer 101, a non-magnetic layer 103 formed on the fixed layer 102, and/or the free layer 104 which is formed on the non-magnetic layer 103 and whose magnetization direction may be reversed.

A memory device that uses a magnetic field to switch the direction of a desired memory cell may have one or more of the following problems.

First, when the size of a unit cell is reduced to realize a higher density memory device, the coercivity of the free layer 104 may be increased, thereby increasing a switching field of the memory device. Accordingly, the magnitude of a current to be applied to the memory device may have to be larger. Second, in a memory device that includes a plurality of memory cells, the memory cells around the first conductive line 16a and the second conductive line 16b may be affected by the magnetic field and undesired memory cells may also be switched. As a result, in the magnetic memory device that uses the magnetic switching method, there may be difficulty in ensuring selectivity and/or higher density. To address the problems described above, a magnetic memory device that uses a current induced switching (CID) method has been studied.

FIG. 1B is a perspective view of a related art memory device that uses the CID method. Referring to FIG. 1B, a magneto-resistive structure 14 and an upper electrode 18 may be sequentially formed on a lower electrode 17, which is electrically connected to a transistor 10. An anti-ferromagnetic layer 101, a fixed layer 102 whose magnetization direction is fixed by the anti-ferromagnetic layer 101, a non-magnetic layer 103, and/or a free layer 104 which may be formed on the non-magnetic layer 103 and whose magnetization direction can be reversed may be sequentially formed on the magneto-resistive structure 14 that corresponds to the lower electrode 17.

In the CID method of FIG. 1B, the free layer 104 may be directly switched to a desired direction by using spin transfer of electrons by applying a current whose spin is polarized in one direction to the magneto-resistive structure 14 through the lower electrode 17.

This method may be advantageous for realizing higher density because as the cell size is reduced, the required current may be reduced. An issue of the magnetic memory device that uses the CID method is that a critical current required for switching may still be too large to commercialize. Thus, studies for reducing the critical current are in progress.

Methods of reducing the critical current that have been proposed will now be described.

First, the reduction of a polarization factor may reduce the critical current. As the polarization factor of an inputted current becomes larger, the critical current required for switching may be reduced. However, because the polarization factor is a basic property of a substance, the polarization may be slightly increased. Second, a method of using a multi-layer structure has been proposed; however, this process is complicated. Third, studies have been conducted about using a half-metal because it is known that the half-metal theoretically has a large polarization factor. However, a half-metal may still be difficult to apply to products. Fourth, a method of reducing the value of remnant magnetization and thickness of a magnetic layer has been proposed. However, due to the superparamagnetic effect caused by the reduction of the volume of cell itself, the stability of recorded information may not be ensured.

SUMMARY

Example embodiments may provide a magnetic memory device that has a structure that may reduce a critical current required for switching a memory device that uses a CID method. According to an example embodiment, there may be provided a magnetic memory device that uses a current induced switching method, including a lower electrode, a magnetic resistance structure formed on the lower electrode and having a first free layer with two sides and a distance between the two sides in a width direction is varied, and an upper electrode formed on the magnetic resistance structure.

The widths of the two sides of the free layer may be concaved towards the center of the sides and the free layer may have an elliptical structure.

The magnetic resistance structure may include an anti-ferromagnetic layer formed on the lower electrode, a fixed layer whose magnetization direction is fixed by the anti-ferromagnetic layer, a non-magnetic layer formed on the fixed layer and/or the first free layer formed on the non-magnetic layer. Alternatively, the magnetic resistance structure may include a first free layer formed on the lower electrode, a non-magnetic layer formed on the first free layer, a second free layer formed on the non-magnetic layer, and an anti-ferromagnetic layer which is formed on the second free layer, which fixes the magnetization direction of the second free layer. The first free layer and second free layer may include four sides that have two sides parallel to each other and two sides whose widths are varied.

The first free layer and second free layer may include four sides that have two sides parallel to each other and two sides whose widths are concaved towards the center of the sides.

BRIEF DESCRIPTION OF THE DRAWINGS

The above, as well as other features and advantages of example embodiments will become more apparent by describing in detail the example embodiments with reference to the attached drawings in which.

DETAILED DESCRIPTION OF EXAMPLE EMBODIMENTS

Figure 1A:
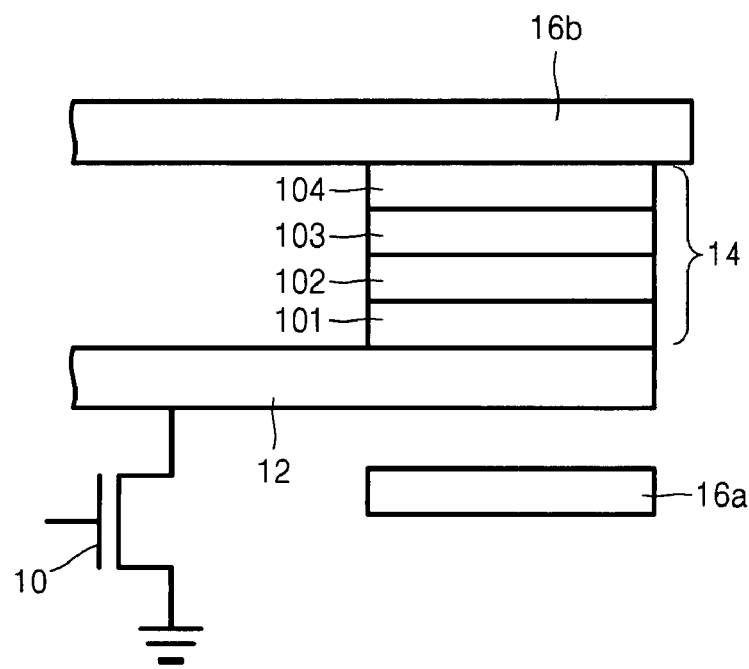
FIG. 1A is a cross-sectional view of a magnetic random access memory (MRAM) that uses a related art magnetic switching method.
Figure 1B:
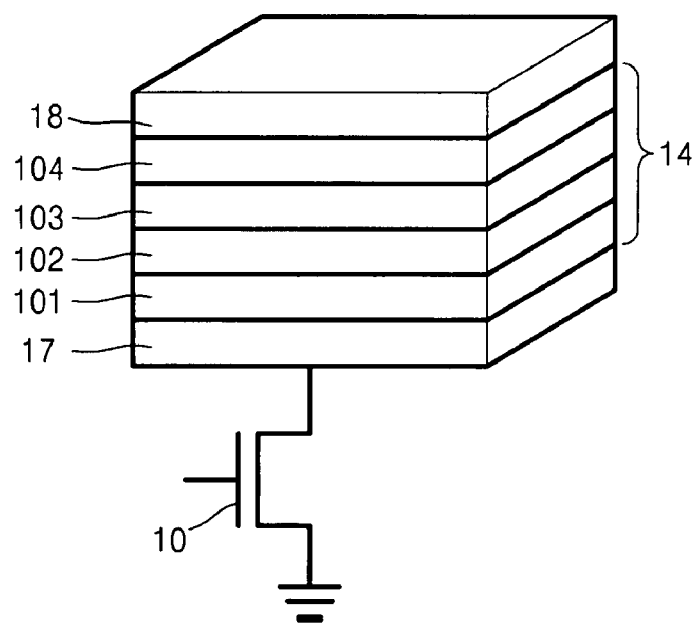
FIG. 1B is a perspective view of a memory device that uses a current induced switching (CID) method.

A magnetic memory device that uses a current induced switching (CID) method, according to example embodiments, will now be described more fully with reference to the accompanying drawings. In the drawings, the thicknesses of layers and regions are exaggerated for clarity.

Detailed illustrative embodiments of example embodiments are disclosed herein. However, specific structural and functional details disclosed herein are merely representative for purposes of describing example embodiments. The example embodiments may, however, be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In the magnetic memory device that uses a CID method according to an example embodiment, to reduce a critical current value that may be needed for switching a free layer, the structure of a magnetic memory cell, in particular, the structure of the free layer, may not be formed in a rectangular structure, but rather to a structure in which the widths of two sides facing each other are varied.

Figure 2A:
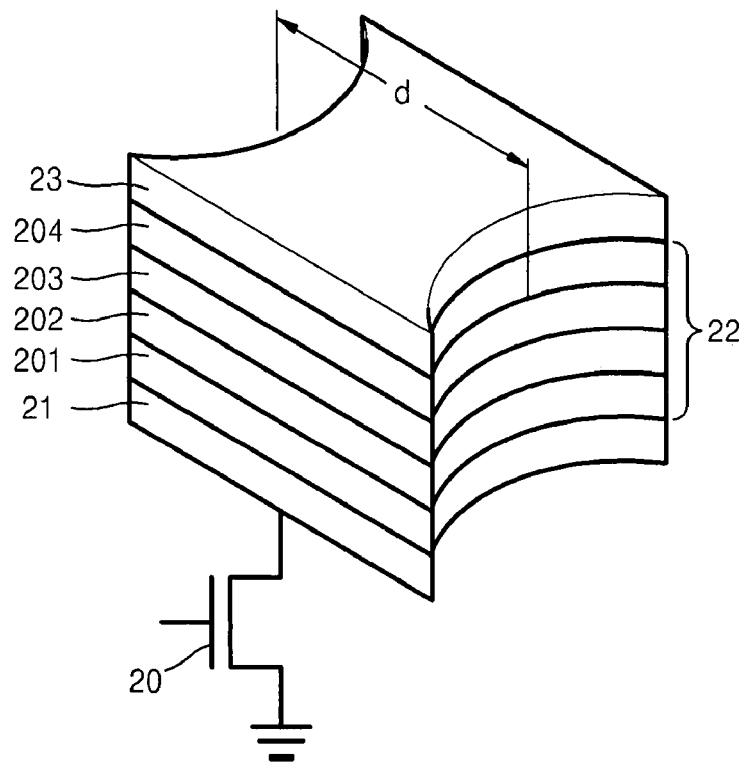
FIG. 2A is a perspective view of a related art memory device that uses a CID method according to an example embodiment.

FIG. 2A is a perspective view of a memory device that uses a CID method according to an example embodiment.

Referring to FIG. 2A, a magnetic memory device that uses a CID method according to an example embodiment may include a switching structure, for example, a magnetic resistance structure 22 and an upper electrode 23 formed on a lower electrode 21, which may be electrically connected to dopant regions (not shown) such as source and drain regions of a transistor 20. The magnetic resistance structure 22 may include an anti-ferromagnetic layer 201, a fixed layer 202 whose magnetization direction may be fixed by the anti-ferromagnetic layer 201, a non-magnetic layer 203, and/or a free layer 204. In a magnetic memory device that uses a CID method, according to an example embodiment, the free layer 204, may have two sides facing each other and a distance between the two sides may vary. In FIG. 2A, the magnetic memory device may have four sides, including two sides parallel to each other and the other two sides that gradually bend toward one another to form a concave shape.

In example embodiments, the lower electrode 21 and the upper electrode 23 may be formed of a conductive material, such as a metal or metal oxide used for an electrode of a magnetic memory device. The anti-ferromagnetic layer 201 may be formed of an alloy containing mainly Mn, for example, IrMn, FeMn, or NiMn. The fixed layer 202 whose magnetization direction is fixed by the anti-ferromagnetic layer 201 may be formed of, for example, NiFe or CoFe. In the case of a giant magnetoresistance (GMR) device, the non-magnetic layer 203 may be a spacer layer formed of Cu. In the case of a tunneling magnetoresistance (TMR) device, the non-magnetic layer 203 may be an insulating layer formed of an aluminum oxide. The free layer 204, whose polarization direction can be changed by electrons, may be formed of a ferromagnetic material, such as NiFe or CoFe.

Figure 2B:
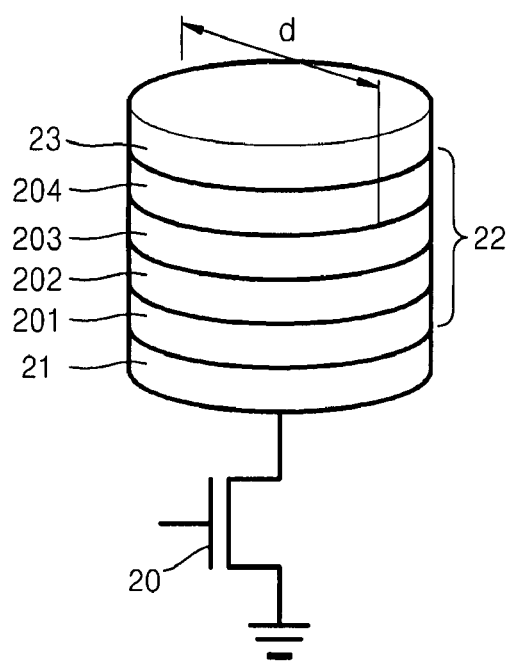
FIG. 2B is a perspective view of a memory device that uses a CID method according to an example embodiment.

FIG. 2B is a perspective view of a memory device that uses a CID method according to an example embodiment. In the memory device that uses a CID method, a magnetic resistance structure 22, for example, a free layer 204 may have a structure in which a width is gradually increased towards the center of the free layer 204, thereby resembling an elliptical structure.

Referring to FIG. 2B, the memory device that uses a CID method according to an example embodiment may include a magnetic resistance structure 22 and an upper electrode 23 formed on a lower electrode 21, which may be electrically connected to dopant regions (not shown), such as source and drain regions of a transistor 20. The magnetic resistance structure 22 may include an anti-ferromagnetic layer 201, a fixed layer 202 whose magnetization direction may be fixed by the anti-ferromagnetic layer 201, a non-magnetic layer 203, and a free layer 204. In FIG. 2B, the magnetic memory device may have a structure in which the widths facing each other gradually increase, unlike the magnetic memory device of FIG. 2A. In FIG. 2B, the layers of the memory device that uses a CID method may be formed by the same materials used for forming the layers and are shown having identical reference numerals with those described with reference to FIG. 2A.

Figure 2C:
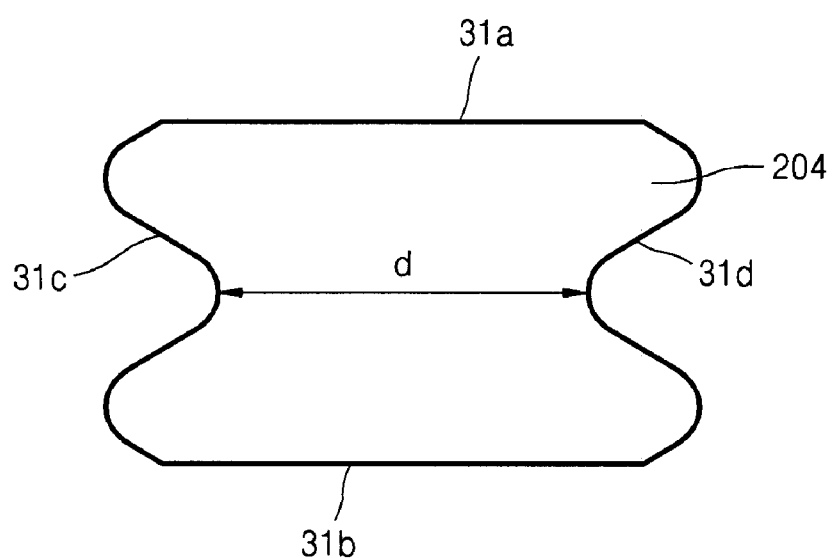
FIG. 2C is a plan view of a free layer of a magnetic memory device that uses a CID method according to an example embodiment.

FIG. 2C is a plan view of a free layer 204 of a magnetic memory device that uses a CID method according to an example embodiment. In FIG. 2A, a width d of two sides of the free layer 204 may be gradually decreased toward the center of the sides. In FIG. 2B, a width d between the two sides facing each other may be gradually increased towards the center of the free layer 204. In FIG. 2C, the free layer 204 may have four sides 31a, 31b, 31c, and 31d, and may include two sides, 31a and 31b, that are parallel to each other, and two sides, 31c and 31d, that are not parallel to each other. That is, the two sides 31c and 31d that are not parallel to each other may have a width d that may have a shape in which the width d increases towards an inner side of the free layer 204 and then decreases. That is, the width d may have an hourglass shape formed by cutting corner portions of the structure of FIG. 2A.

In FIGS. 2A and 2B, the layers that constitute the magnetic memory device may have a substantially identical shape. However, in the magnetic memory device that uses a CID method, the free layer 204 may be formed to a structure in which the widths of the sides facing each other are varied. The anti-ferromagnetic layer 201, the fixed layer 202, and the non-magnetic layer 203 may be formed to a rectangular structure as in the related art, or may be formed to a similar shape and structure as the free layer 204.

In FIGS. 2A and 2B, the magnetic resistance structure 22 may have the anti-ferromagnetic layer 201 formed on the lower electrode 21. A structure in which the free layer 204, the non-magnetic layer 203, the fixed layer 202, and the anti-ferromagnetic layer 201 are sequentially stacked may also be formed. The magnetic memory device may further include a buffer layer, an under layer, and an upper layer.

A process of manufacturing a magnetic memory device that uses a CID method according to an example embodiment will now be described.

The magnetic memory device that uses a CID method may be formed by using a related art semiconductor manufacturing process, in particular, a MRAM manufacturing process. For example, the transistor 20 may be formed such that, after forming a gate insulating layer and an electrode layer on a substrate, both sides of the substrate are exposed, which may allow the source and drain to be formed by doping. After coating an insulating material on the transistor 20, a contact hole that exposes the source or the drain may be formed. After the contact hole is filled with a conductive material, the lower electrode 21 may be formed. The anti-ferromagnetic layer 201, the fixed layer 202, the non-magnetic layer 203, and/or the free layer 204 may be sequentially formed on the lower electrode 21. After the free layer 204 is etched, or otherwise formed, in a shape in which the widths of sides facing each other are varied, the upper electrode 23 may be formed on the etched free layer 204.

Figure 3:
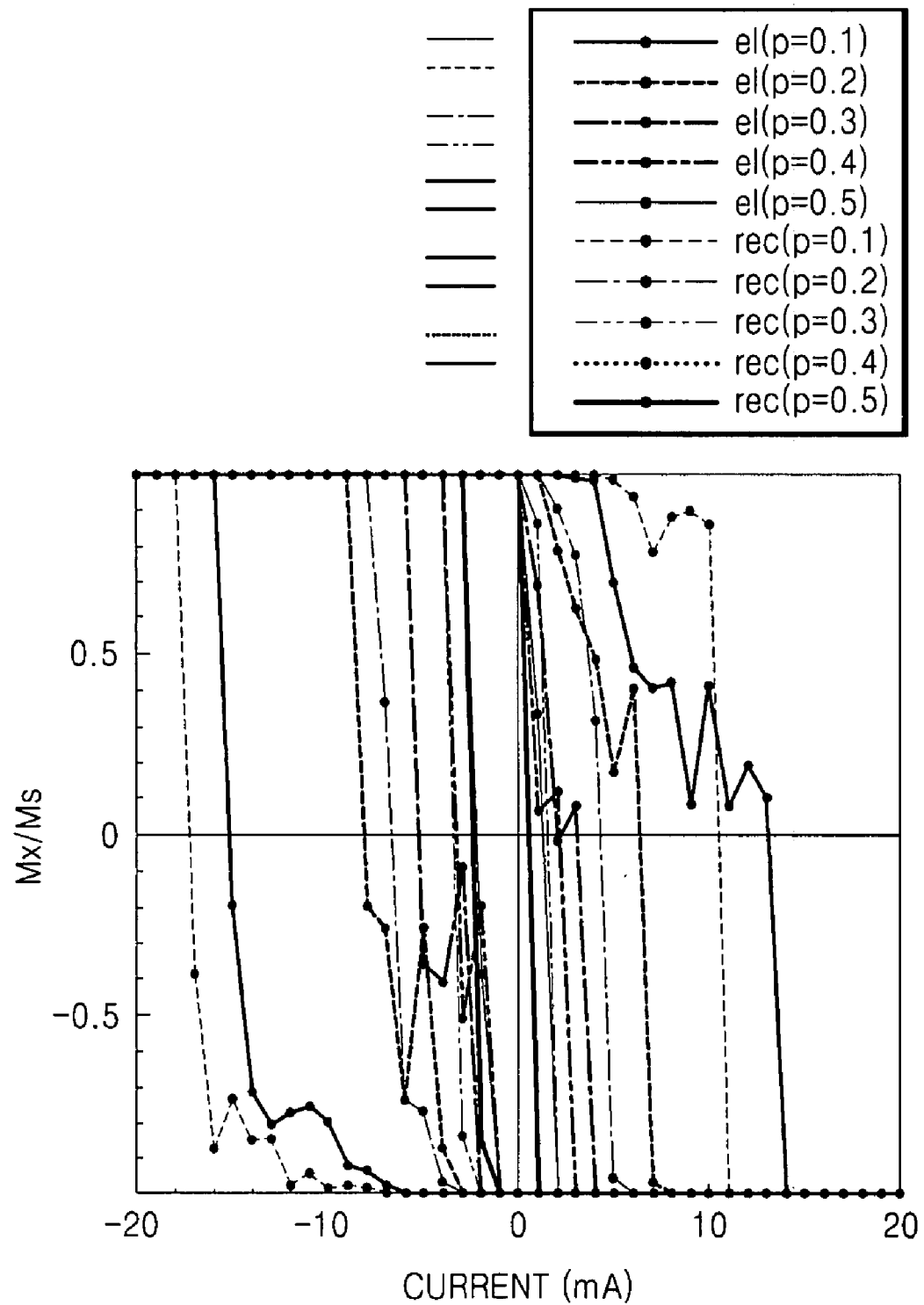
FIG. 3 is an example graph showing the variation of switching characteristics according to polarization constant change of a magnetic memory device having an elliptical or rectangular structure.

FIG. 3 is an example graph showing a simulation result of the variation of switching characteristics according to polarization constant change of a magnetic memory device that uses a CID method according to an example embodiment and a magnetic memory device that has a related art rectangular structure. The horizontal axis indicates the magnetization inversion of the free layer, (i.e., a current required for switching the free layer), and the vertical axis indicates normalized values Mx/Ms of magnetization saturation values.

Referring to FIG. 3, required currents of specimens el (p=0.1, 0.2, 0.3, 0.4, 0.5) having the polarization constants of the magnetic memory device, that has a free layer in a rectangular structure, of 0.1, 0.2, 0.3, 0.4, and 0.5 are compared to specimens el (p=0.1, 0.2, 0.3, 0.4, 0.5) having the polarization constants of the magnetic memory device, that has a free layer in an elliptical structure, of 0.1, 0.2, 0.3, 0.4, and 0.5. If the polarization constants of both the magnetic memory devices are identical, the specimens that have the free layer in an elliptical structure needed currents almost half of the level of the specimens that have the free layer in a rectangular structure.

Figure 4:
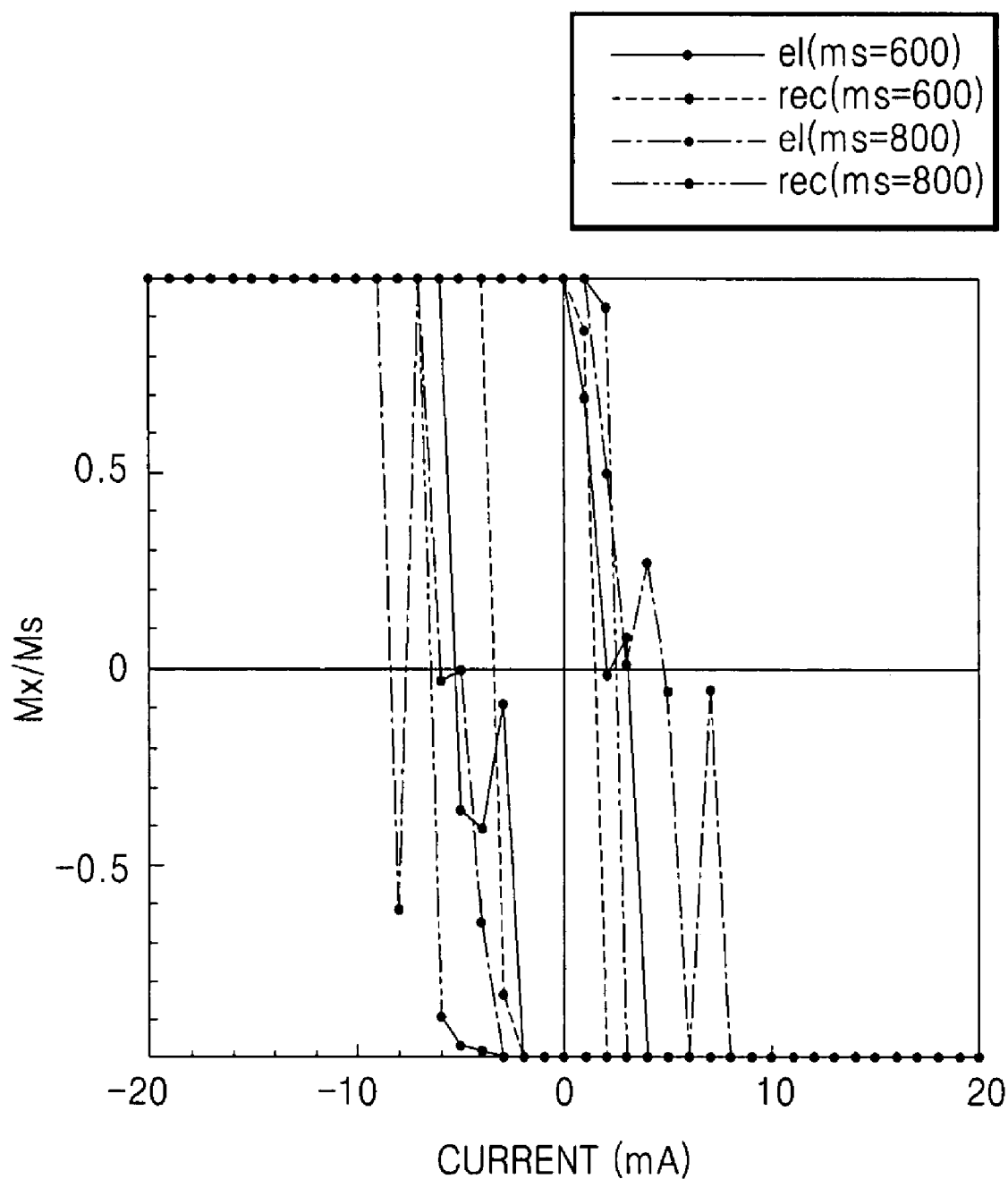
FIG. 4 is an example graph showing the variation of switching characteristics according to remnant magnetization value of a magnetic memory device having an elliptic or rectangular structure.

FIG. 4 is an example graph showing the simulation result of the variation of switching characteristics according to remnant magnetization value of a magnetic memory device that uses a CID method according to an example embodiment and a magnetic memory device that has a related art rectangular structure. The horizontal axis indicates a current needed for switching the free layer. The vertical axis indicates normalized values Mx/Ms of magnetization saturation values.

Referring to FIG. 4, currents needed for switching the free layer were measured with respect to a magnetic memory device that has a free layer in an elliptical structure and a magnetic memory device that has a free layer in a rectangular structure, respectively having a remnant magnetization ms of 600 and 800 ems/cc. Also, a magnetic memory device having an elliptical shaped free layer needed currents almost half of the level of the magnetic memory device having a related art rectangular free layer. It is seen that the needed current of the magnetic memory device that has a free layer in a rectangular structure and a remnant magnetization ms of 800 ems/cc is similar to that of the magnetic memory device that has a free layer in an elliptical structure and a remnant magnetization ms of 600 ems/cc.

Consequently, a magnetic memory device according to example embodiments may have a lower critical current required for switching the free layer and/or higher recording stability when compared to a magnetic memory device that has a related art rectangular structure.

A magnetic memory device that uses a CID method according to an example embodiment may have one or more of the following advantages.

First, unlike a magnetic memory device that uses a conventional CID method, the magnetic memory device that uses a CID method according to example embodiments may have a reduced critical current for memory switching and/or increased recording reliability by forming the magnetic memory device in a structure in which a width between two sides of the free layer that face each other are gradually decreased.

Second, the magnetic memory device that uses a CID method according to example embodiments may be manufactured using a related art semiconductor manufacturing process, and may have the advantage of mass production because the magnetic memory device has a simple structure.

While example embodiments have been described with reference to the drawings, it should not be construed as being limited to the example embodiments set forth herein. Those who are skilled in this art, for example, may acknowledge that the magnetic resistance structure of the magnetic memory device that uses a CID method may have a structure in which a lower electrode, a free layer, a non-magnetic layer, a fixed layer, and a anti-ferromagnetic layer are sequentially formed, and may further include a buffer layer, an under layer, and/or an upper layer. Also, in the switching structure, a diode may be used in place of the transistor. Also, in the structure of FIG. 2A, the two sides parallel to each other may also be formed to change the width. Therefore, the scope of the example embodiments is defined not by the detailed description of example embodiments, but by the appended claims.

What is claimed is:

1. A magnetic memory device, comprising:
   a lower electrode;
   a magnetic resistance structure on the lower electrode; and
   an upper electrode on the magnetic resistance structure;
   wherein
   the magnetic resistance structure includes a first free layer,
   a distance between two sides of the first free layer in a width direction varies, and
   the lower electrode, the upper electrode and the magnetic resistance structure, except for the first free layer, have a substantially different shape as the first free layer.

2. The magnetic memory device of claim 1, wherein the two sides of the first free layer are concaved towards a center of the sides.

3. The magnetic memory device of claim 1, wherein the distance between the two sides of the first free layer increases towards a center of the two sides and decreases away from the center of the sides.

4. The magnetic memory device of claim 1, wherein the two sides of the first free layer are opposite one another and are convexed toward one another.

5. The magnetic memory device of claim 1, wherein the first free layer has an elliptical structure.

6. The magnetic memory device of claim 1, wherein the first free layer has four sides including two sides parallel to each other and two sides that are not parallel.

7. The magnetic memory device of claim 1, wherein the first free layer has four sides including two sides having a width that decreases toward a center of the two sides.

8. The magnetic memory device of claim 1, wherein the first free layer has four sides including two sides having a width that increases toward a center of the two sides, and then, decreases away from the center of the two sides.

9. The magnetic memory device of claim 1, wherein the two sides of the first free layer are mirror images of one another.

10. The magnetic memory device of claim 1, wherein the distance between the two sides of the first free layer in a width direction varies along a length of the two sides.

11. The magnetic memory device of claim 1, wherein the magnetic resistance structure includes:
    an anti-ferromagnetic layer on the lower electrode;
    a fixed layer whose magnetization direction is fixed by the anti-ferromagnetic layer;
    a non-magnetic layer on the fixed layer; and
    the first free layer is on the non-magnetic layer.

12. The magnetic memory device of claim 1, wherein the magnetic resistance structure includes:
    the first free layer on the lower electrode;
    a non-magnetic layer on the first free layer;
    a second free layer on the non-magnetic layer; and
    an anti-ferromagnetic layer on the second free layer and fixes the magnetization direction of the second free layer.

* * * * *